US012696748B2

(12) United States Patent
Kim et al.

(10) Patent No.: US 12,696,748 B2
(45) Date of Patent: Jul. 28, 2026

(54) LIGHT SOURCE DEVICE AND DISPLAY APPARATUS HAVING THE SAME

(71) Applicant: GLOBAL TECHNOLOGIES CO., LTD., Hwaseong-si (KR)

(72) Inventors: Min Seon Kim, Hwaseong-si (KR); Yong Geun Kim, Suwon-si (KR)

(73) Assignee: GLOBAL TECHNOLOGIES CO., LTD. (KR)

( * ) Notice: Subject to any disclaimer, the term of this patent is extended or adjusted under 35 U.S.C. 154(b) by 636 days.

(21) Appl. No.: 18/114,221

(22) Filed: Feb. 24, 2023

(65) Prior Publication Data

US 2024/0274769 A1 Aug. 15, 2024

(30) Foreign Application Priority Data

Feb. 15, 2023 (KR) ........................ 10-2023-0020025

(51) Int. Cl.
| | |
|---|---|
| *H10W 20/20* | (2026.01) |
| *H10H 20/85* | (2025.01) |
| *H10H 20/857* | (2025.01) |
| *H10W 80/00* | (2026.01) |
| *H10W 90/00* | (2026.01) |

(52) U.S. Cl.
CPC ........ *H10W 20/20* (2026.01); *H10H 20/8506* (2025.01); *H10H 20/857* (2025.01); *H10W 20/211* (2026.01); *H10W 80/312* (2026.01); *H10W 80/701* (2026.01); *H10W 90/00* (2026.01); *H10W 90/701* (2026.01)

(58) Field of Classification Search
None
See application file for complete search history.

(56) References Cited

U.S. PATENT DOCUMENTS

| | | | | |
|---|---|---|---|---|
| 2012/0252162 A1* | 10/2012 | Sadaka | ............... | H10W 72/019 |
| | | | | 438/107 |
| 2016/0293811 A1* | 10/2016 | Hussell | ............... | H10H 20/857 |
| 2018/0254226 A1* | 9/2018 | Iguchi | ................. | H01L 25/0753 |
| 2021/0375833 A1* | 12/2021 | Lee | ....................... | H10H 20/857 |
| 2022/0139890 A1* | 5/2022 | Lin | ..................... | H01L 25/0753 |
| | | | | 257/79 |
| 2024/0172361 A1* | 5/2024 | Wang | .................... | H01L 21/486 |

FOREIGN PATENT DOCUMENTS

| | | | |
|---|---|---|---|
| JP | 2012227514 A | 11/2012 | |
| KR | 20130056564 A | 5/2013 | |
| KR | 20150051304 A | 5/2015 | |
| WO | WO2021017711 | * | 2/2021 |

* cited by examiner

*Primary Examiner* — Feifei Yeung Lopez
(74) *Attorney, Agent, or Firm* — Renaissance IP Law Group LLP

(57) ABSTRACT

Provided are a light source device and a display apparatus having the same, and more particularly, to a light source device that is capable of controlling light and a display apparatus including the same. A light source device includes a LED chip configured to emit light, a driving controller provided with a control circuit to control driving of the LED chip, and an electrode pad provided on a top surface of the driving controller so that the LED chip is bonded and configured to transmit an electrical signal provided from the driving controller to the LED chip.

11 Claims, 2 Drawing Sheets

120 : 121, 122, 123, 124, 125

120 : 121, 122, 123, 124, 125

LIGHT SOURCE DEVICE AND DISPLAY APPARATUS HAVING THE SAME

CROSS-REFERENCE TO RELATED APPLICATION

This application claims priority to Korean Patent Application No. 10-2023-0020025 filed on Feb. 15, 2023 and all the benefits accruing therefrom under 35 U.S.C. § 119, the contents of which are incorporated by reference in their entirety.

BACKGROUND

The present disclosure relates to a light source device and a display apparatus having the same, and more particularly, to a light source device that is capable of controlling light and a display apparatus including the same.

In general, a light emitting diode (LED) for display is a device that converts electricity into infrared rays or light by using characteristics of a compound semiconductor and individually controls brightness of three primary colors of light emitted from a plurality of devices to mix the colors, thereby realizing various colors.

In the related art, a semiconductor device for controlling each of light emitting diode elements is mounted together around an emission surface and is electrically complicatedly connected to one printed circuit board to deteriorate light efficiency due to a design limitation of the board, many components on the emission surface, and a spatial limitation.

In addition, in outdoor and indoor display modules, three-color light emitting diodes are arranged in a matrix form and electrically connected to one printed circuit board, and each of the three-color light emitting diodes forms a lower electrode of the printed circuit board so that components for controlling light are disposed on an opposite surface through an internal multilayered layers. As a result, cost and defect rates in manufacturing the printed circuit board having the multilayered layers for lines inevitably increase, and precision of the printed circuit board and components for controlling an amount of light so as to control more light emitting diodes in the limited space are inevitably limited, and thus, it is difficult to realize a display having higher resolution.

Recently, as demands for light emitting diode displays requiring high resolution in a small size (inch) increases, a thickness of the device gradually decreases, and thus, a thickness of the small display mounted in the device also decreases.

Currently, the light emitting diode display has to increase in degree of integration in the form of a three-color package or the form of chip on board (COB), in which three-color chips are mounted, and to make a printed circuit board having four or more layers for electrical connection. As a result, the light emitting diode display has a structure in which it is difficult to reduce the thickness. In order to reduce the thickness of the light emitting diode display, the number of components has to be reduced, and the printed circuit board has to be simplified to reduce the thickness. However, in the structure of the light emitting diode display in accordance with the related art, since a controller of each of the light emitting diodes has to be disposed on a bottom surface of the light emitting module, and thus, there is a limit to improving the degree of integration and manufacturing in thin thickness.

That is, in the display in accordance with the related art, multi-color light emitting diodes have be disposed, elements for controlling each light emitting diode have be disposed therearound, and the light emitting diodes and control components have be mounted in different processes. Due to this, it is difficult to implement a flexible display or a transparent display in which only light emitting sources are arranged.

In addition, in the structure in accordance with the related art, in implementing the transparent display in which an area except for the light emitting source is transparent, since the light emitting diode chips are arranged like the light emitting diode control elements, two components act as factors in reducing transparency, there is a limit to implement a more transparent display. Furthermore, peripheral components act as light absorbers, which inevitably reduce light efficiency, and since the plurality of light emitting diodes have be arranged to secure desired resolution and brightness, the plurality of light emitting diodes and the control elements have be individually mounted on the board, and thus, there are also limitations that the work is cumbersome, and a lot of time is consumed.

Therefore, since the light emitting source and the controller are provided as one thin substrate, there is an urgent need for a product that increases in resolution by thinning the light emitting display and arranging more light emitting diodes on a small area.

PRIOR ART DOCUMENT

Patent Document

Korean Patent Publication No. 10-2013-0056564

SUMMARY

The present disclosure provides a light source device which is miniaturized by providing a LED chip on a top surface of a driving controller so as to be minimized and integrated into a single driver-integrated device, and a display apparatus including the same.

In accordance with an exemplary embodiment, a light source device includes: a LED chip configured to emit light; a driving controller provided with a control circuit to control driving of the LED chip; and an electrode pad provided on a top surface of the driving controller so that the LED chip is bonded and configured to transmit an electrical signal provided from the driving controller to the LED chip.

The driving controller may include a substrate on which the control circuit is disposed, and the electrode pad may be laminated on a top surface of the substrate on which the control circuit is disposed.

The light source device may further include an external connection pad provided on a bottom surface of the driving controller and electrically connected to the control circuit to transmit an electrical signal provided from the outside to the control circuit.

The driving controller may further include a through-electrode connected to the external connection pad to pass through the substrate.

The light source device may further include a test pad provided on the top surface of the driving controller so as to be electrically connected to the control circuit and configured to perform electrical measurement.

The light source device may further include a via plug connected to the test pad to partially pass through the driving controller.

The driving controller may further include: a shared connection pad disposed on the top surface of the substrate so as to be connected to the control circuit and configured to electrically connect each of a lower end of the via plug and an upper end of the through-electrode to the control circuit, wherein the lower end of the via plug and the upper end of the through-electrode may be misaligned to be connected to top and bottom surfaces of the shared connection pad, respectively.

The test pad may be spaced apart from the electrode pad and provided on an edge portion of the top surface of the driving controller.

A lower end of the through-electrode may have a diameter of 30 μm to 800 μm and greater than that of an upper end of the through-electrode.

The through-electrode may have a length of 40 μm to 1,000 μm.

The external connection pad may be provided in plurality, and an interval between the plurality of external connection pads may range of 30 μm to 800 μm.

The driving controller may further include an insulating layer disposed on the top surface of the substrate, the control circuit may include: a line layer disposed on the top surface of the substrate so as to be covered by the insulating layer; and a conductive via configured to at least partially pass through the insulating layer so as to be connected to the line layer, and the electrode pad may be disposed on the insulating layer so as to be connected to the conductive via.

The light source device may further include a molding part configured to cover the LED chip on the driving controller.

The molding part may include a black additive, a scattering agent, or a fluorescent material.

The LED chip may be provided in plurality, the plurality of LED chips may include first and second electrodes, and the electrode pad may include: a first electrode pad connected to the first electrode of each of the LED chips; and a second electrode pad connected to the second electrode of each of the LED chips.

Each of an interval between two adjacent first electrode pads and an interval between two adjacent second electrode pads may range of 1 μm to 300 μm.

Each of the LED chips may be flip-chip bonded by directly connecting the first electrode and the second electrode to the first electrode pad and the second electrode pad, respectively.

In accordance with another exemplary embodiment, a display apparatus includes: a light source device in accordance with an exemplary embodiment; and a circuit board on which a plurality of light source devices are arranged and mounted.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
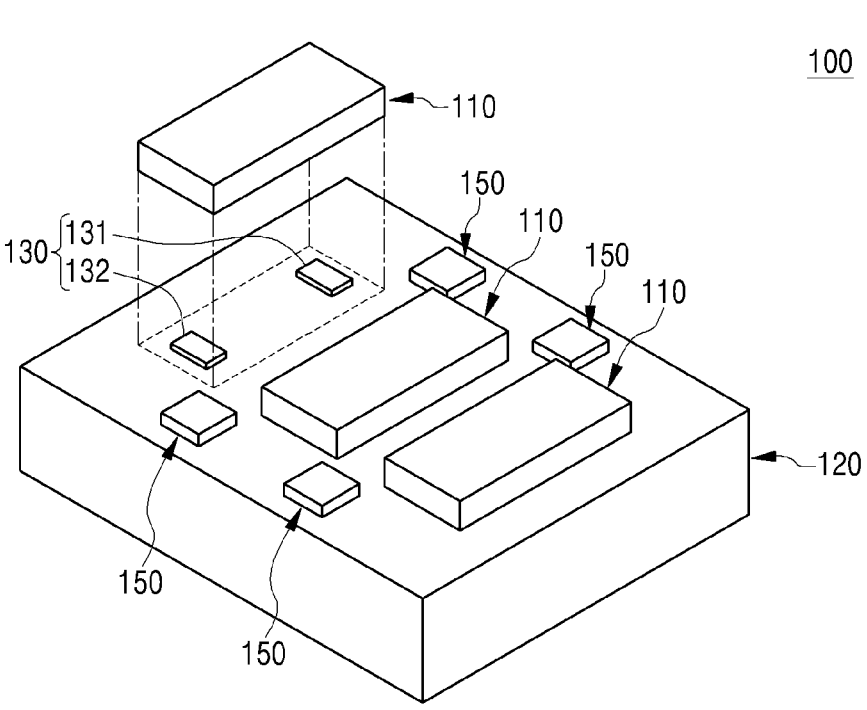
FIG. 1 is a schematic perspective view illustrating a light source device in accordance with an exemplary embodiment.

Hereinafter, specific embodiments will be described in more detail with reference to the accompanying drawings.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

FIG. 1 is a schematic perspective view illustrating a light source device in accordance with an exemplary embodiment.

Referring to FIG. 1, a light source device 100 in accordance with an embodiment may include a LED chip 110 that emits light, a driving controller 120 provided with a control circuit 125 for controlling driving of the LED chip 110, and an electrode pad 130 which is provided on a top surface of the driving controller 120 so that the LED 110 is bonded and transmits an electrical signal provided from the driving controller 120 to the LED chip 110.

The LED (light emitting diode) chip 110 may emit light and may be used as a light emitting source. For example, the LED chip 110 may include an inorganic light emitting diode (OLED) and an organic light emitting diode (OLED). Here, the inorganic light emitting diode capable of implementing high luminance with a fast response speed and low power consumption may be preferred. In addition, the organic light emitting diode (OLED) may be vulnerable to exposure to moisture and oxygen and also may require an encapsulation process and have low durability, whereas the inorganic light emitting diode may not require the encapsulation process and have the strong durability, unlike the organic light emitting diode (OLED).

Here, the LED chip 110 may be the micro LED (μLED) having the short side length of approximately 100 μm or approximately several μm to several tens of μm. As described above, the micro-unit LED chip 110 may be employed to reduce a size of a pixel and implement the high resolution within the same screen size. In addition, when the LED chip 110 is manufactured in a micron size, even if an inorganic light emitting diode is used, a limitation of being broken when bent may be solved due to the nature of inorganic materials. That is, when the micro-inorganic light-emitting diode chip is transferred to a flexible substrate, even if the flexible substrate is bent, since an inorganic light emitting diode chip is not broken, a flexible display apparatus may be implemented. Thus, the display apparatus 200 that employs the micro LED chip 110 may be applied to various fields using a subminiatured pixel size and a thin thickness.

The driving controller 120 may include a control circuit 125 for controlling driving of the LED chip 110 to control the driving of the LED chip 110. For example, the driving controller 120 may transmit a driving signal such as an electrical signal to the LED chip 110 and may control the LED chip 110. Here, the driving controller 120 may include the control circuit 125 to individually control the LED chip 110, and the electrical signal transferred (or transmitted) from the outside to drive the LED chip 110 (or a driving signal) may be input to the control circuit 125. Here, the driving controller 120 may control the driving of the LED chip 110 in an active matrix (AM) manner or a passive matrix (PM) manner, and in the case of the active (AM) manner, the control circuit 125 may include a thin film transistor (TFT) and may be provided in the same number as the number of LED chips 110.

The control circuit 125 may individually control the driving of (a plurality of) LED chips 110 inside the driving controller 120, and thus, turning on/off of (each of) LED chips 110 may be controlled, and each of the plurality of LED chips 110 may be selectively turned on/off. For example, when the LED chip 110 is provided with three color LED chips 110 constituted by red (R), green (G), and blue (B) LED chips, only the red (R) LED chip 110 may be turned on to emit a red color (light), only the green (G) LED chip 110 may be turned on to emit a green color (light), and only the blue LED chip 110 may be turned on to emit a blue color (light). In addition, a white color (light) may be displayed by turning on all the three-color LED chips 110, or a black color may be displayed by blinking all the three-color LED chips 110, and an intensity ratio of the three-color LED chips 110 may be adjusted to emit various colors (phases).

The electrode pad 130 may be provided on a top surface of the driving controller 120 so that the LED chips 110 are bonded thereto, and the electrical signal provided from the driving controller 120 may be transmitted to the LED chips 110. For example, the electrode pad 130 may be provided on the top surface of the driving controller 120 so as to be electrically connected to the control circuit 125, and the LED chips 110 may be bonded to electrically connect the LED chips 110 to the control circuit 125. Thus, the electrical signal may be provided to the LED chips 110 from the driving controller 120, and the electrical signal may be provided to the LED chip 110 from the control circuit 125 through the electrode pad 130. Here, the electrical signal may be a power source (signal) for turning on/off the LED chips 110 or a control signal (or a driving signal) for controlling the turning on/off of each LED chip 110, but is not particularly limited thereto, i.e., it is sufficient if the electrical signal is transmitted electrically.

The light source device 100 in accordance with an exemplary embodiment may bond the LED chips 110 to the electrode pad 130 provided on the top surface of the driving controller 120 so as to be minimized and integrated into a single driver-integrated device, and thus, when the LED chips 110 are provided in plurality, the light source device may be miniaturized and subminiatured.

In addition, in the present disclosure, rather than a structure in which the plurality of LED chips 110 are directly connected to an external controller (not shown) to control the turning on/off, a structure in which the plurality of LED chips 110 are connected to the control circuit 125 provided inside the driving controller 120 to individually control the driving by the control circuit 125. As a result, the turning on/off of the LED chip 110 may be controlled in the light source device 100 without drawing out complex lines to connect the plurality of LED chips 110 to the external controller (not shown), and a signal path between the plurality of LED chips 110 and the control circuit 125 may be shortened to improve electrical characteristics of the light source device 100. Thus, the number of components for controlling the plurality of LED chips 110 may be reduced, and a forming (or mounting) operation of the component(s) may be simplified.

On the other hand, in the related art, a driving IC (IC-driver) may be mounted on the same (flat) surface as the bonding surface of the LED chip 110 to protrude to a light emitting direction of the LED chip 110, and thus, there is a limitation in that light emitted from the LED chip 110 is absorbed to the driving IC to cause a light loss.

However, the light source device 100 in accordance with an exemplary embodiment may provide the driving controller 120 at an opposite side of the light emitting direction of the LED chips 110 to provide the bonding surface of the LED chips 110, thereby providing the light emitted from the LED chips 110 from interfering with the driving controller 120 or being absorbed to the driving controller 120. As a result, the typical limitation of the light loss occurring by being absorbed by the driving IC may be solved, and the light loss by the driving controller 120 may be excluded (or eliminated) to minimize the light loss of the light source device 100.

Here, the driving controller 120 may include a substrate 121 on which the control circuit 125 is formed. The control circuit 125 may be provided on the substrate 121, and as many control circuits 125 as the number of LED chips 110 may be provided. Alternatively, one control circuit 125 may be provided to control on two or more LED chips 110. For example, the substrate 121 may be implemented as one of substrates made of various materials, such as a silicon (Si) substrate, a glass substrate, a plastic substrate, and a cavity substrate, and the control circuit 125 may be grown (or deposited to be laminated) on the top surface of the substrate 121.

Here, the electrode pad 130 may be laminated on the top surface of the substrate 121 on which the control circuit 125 is disposed, and the control circuit 125 may be formed (or grown) on the top surface of the substrate 121 and then be laminated on the (uppermost) top surface of the driving controller 120.

Figure 2:
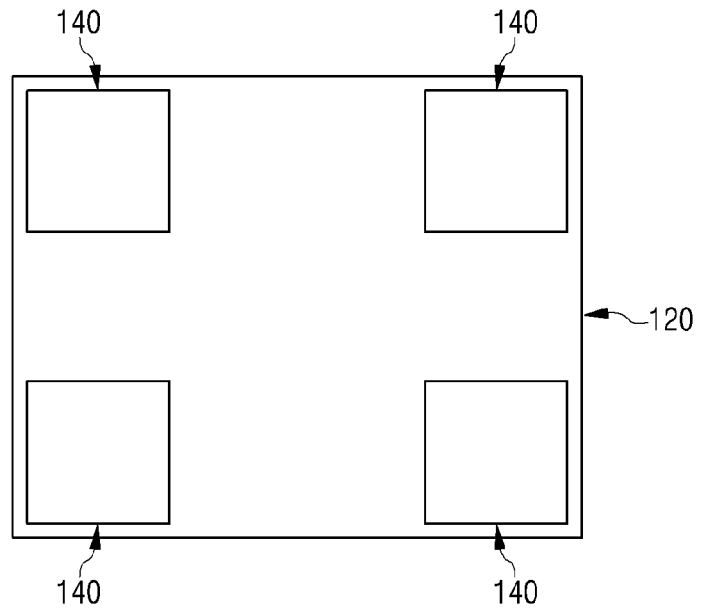
FIG. 2 is a bottom plan view illustrating the light source device in accordance with an exemplary embodiment.
Figure 3:
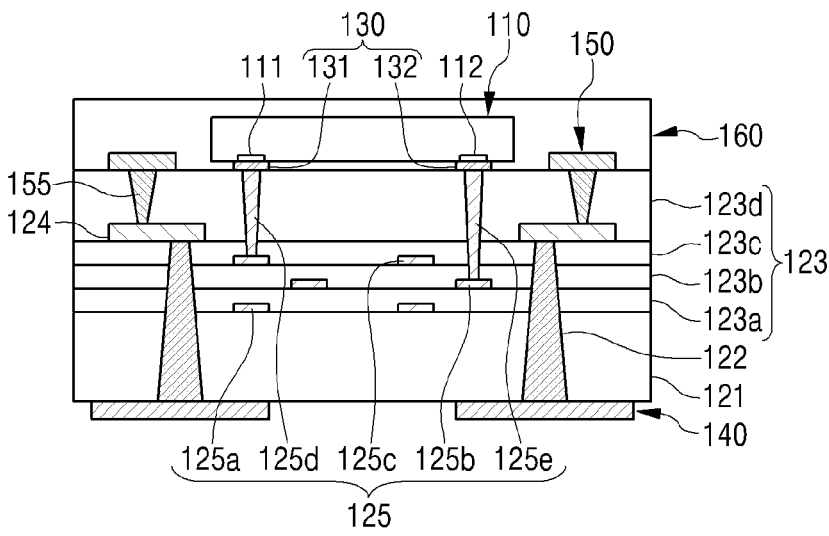
FIG. 3 is a side cross-sectional view illustrating the light source device in accordance with an exemplary embodiment.

FIG. 2 is a bottom plan view illustrating the light source device in accordance with an exemplary embodiment, and FIG. 3 is a side cross-sectional view illustrating the light source device in accordance with an exemplary embodiment.

Referring to FIGS. 2 and 3, the driving controller 120 may further include an insulating layer 123 disposed on the top surface of the substrate 121. The insulating layer 123 may be disposed on the top surface of the substrate 121, may be at least partially applied on the control circuit 125, and may be laminated on the top surface of the substrate 121 in a vertical direction. For example, the insulating layer 123 may include an insulating polymer, epoxy, or a combination thereof, and the (laminated) structure of the control circuit 125 (e.g., the number of laminated line layers or the structure of the thin film transistor) may be laminated in multiple layers, and the multilayered insulating layers 123 may have the same planar area as each other. Here, each of the multilayered insulating layers 123 may have the same planar area as the (planar) area of the top surface of the substrate 121. In FIG. 3, although the insulating layer 123 is illustrated as having a 4-layer structure, but is limited thereto. The insulating layer 123 may include the insulating layer 123(*s*) laminated in three or less layers or may include the insulating layers 123 laminated in five or more layers in some cases.

Here, the control circuit 125 may include line layers 125*a*, 125*b*, and 125*c* disposed on the top surface of the substrate 121 and covered by the insulating layer 123, and conductive vias 125*d* and 125*e* that at least partially pass through the insulating layer 123 and are connected to the line layers 125*a*, 125*b*, and 125*c*. The line layers 125*a*, 125*b*, and 125*c* may be disposed on the top surface of the substrate 121 and may be covered by the insulating layer 123 and coated with the insulating layer 123. Here, the line layers 125*a*, 125*b*, and 125*c* may be directly disposed on the top surface of the substrate 121, and after the top surface of the substrate 121 is coated with the insulating layer 123, the line layers 125*a*, 125*b*, and 125*c* may be disposed on a surface (or an exposed surface) of the insulating layer 123. Each of the line layers 125a, 125b, and 125c may be made of a conductive material (e.g., metal) such as copper (Cu) or aluminum (Al) and may be provided in multiple layers. by interposing the insulating layer 123 therebetween in accordance with the structure of the control circuit 125.

For example, after a line layer 125a of a first layer (or the lowermost layer) that is closest to the top surface of the substrate 121 is disposed, a first insulating layer 123a may be applied on the line layer 125a of the first layer, after a line layer 125b of a second layer is disposed on the first insulating layer 123a, the line layer 125b of the second layer may be coated with the second insulating layer 123b, and after a line layer 125c of a third layer is disposed on the second insulating layer 123b, the line layer of the third layer may be coated with the third insulating layer 123c. As necessary (i.e., the structure of the control circuit), an n-th line layer and an n-th insulating layer may be laminated, and the uppermost insulating layer 123d may be further disposed on the n-th insulating layer.

The conductive vias 125d and 125e may be connected to the line layer 125a or 125b or 125c by at least partially passing through the insulating layer 123, and also may pass through the insulating layer 123 in the vertical direction and be connected to the line layers 125a, 125b, or 125c coated with the insulating layer 123 or may connect the line layers 125a, 125b, and 125c, which are different from each other, to each other. For example, the conductive vias 125d and 125e may pass through a surface of the uppermost insulating layer 123d defining the top surface of the driving controller 120 so that a lower end thereof is connected to the line layers 125a, 125b, or 125c, and an upper end thereof is exposed to the top surface of the driving controller 120. In addition, before forming an (n+1)-th layer while forming multilayered line layers 125a, 125b, and 125c, the conductive vias 125d and 125e may pass through the n-th insulating layer (and/or the uppermost insulating layer) and be connected to a line layer of the n-th layer, or a line layer of the (n+1)-th layer may be connected to the conductive vias 125d and 125e. Here, each of the conductive vias 125d and 125e may also be made of a conductive material such as copper (Cu) or aluminum (Al) and may be made of the same material as the line layers 125a, 125b, and 125c to reduce contact resistance with the line layers 125a, 125b, and 125c.

Here, the electrode pad 130 may be disposed on the insulating layer 123 and connected to the conductive vias 125d and 125e. The electrode pad 130 may be disposed on the uppermost insulating layer 123d or may be connected to an upper end of each of the conductive vias 125d and 125e exposed to the top surface of the driving controller 120. For example, the electrode pad 130 may be disposed on the uppermost insulating layer 123d while being applied on the upper ends of the conductive vias 125d and 125e exposed on the top surface of the driving controller 120. Thus, the electrode pad 130 may be electrically connected to the control circuit 125 to transmit the electrical signal provided from the drive controller 120 to the LED chip 110.

Here, the electrode pad 130 may form a bump or be provided as a metal layer, and the outermost layer (e.g., the uppermost layer) may include a layer for preventing oxidation and may be made of a conductive material such as copper (Cu), silver (Ag), nickel (Ni), gold (Au), or tin (Sn), which has high electrical conductivity.

The conductive vias 125d and 125e may include a first conductive via 125d and a second conductive via 125e, and also, an upper end of the first conductive via 125d may be connected to the first electrode pad 131, and an upper end of the second conductive via 125e may be connected to the second electrode pad 132. In addition, a lower end of the first conductive via 125d and a lower end of the second conductive via 125e may be connected to the line layers 125a, 125b, or 125c of different layers, respectively. Here, the lower end of the first conductive via 125d may be connected to the line layer 125c of the third layer, and the lower end of the second conductive via 125e may be connected to the line layer 125b of the second layer.

The light source device 100 in accordance with an exemplary embodiment may further include an external connection pad 140 that is provided on a bottom surface of the driving controller 120 and is electrically connected to the control circuit 125 to transmit an electrical signal provided from the outside to the control circuit 125.

The external connection pad 140 may be provided on a lower surface (or bottom surface) of the driving controller 120 so to be electrically connected to the control circuit 125 to transmit the electrical signal provided from the outside to the control circuit 125. Here, the external connection pad 140 may be disposed on a lower surface (or bottom surface) of the substrate 121, may be provided to supply power to the LED chip 110, and may be bonded to be in contact with a (connection) terminal of the circuit board 210 while the light source device is mounted on the circuit board 210. Thus, the control circuit 125 provided inside the driving controller 120 may receive (or transmit) the electrical signal such as power, control signal, and clock (CLK) from the outside through the external connection pad 140. The control circuit 125 may individually control the plurality of ELD chips 110 inside the driving controller 120 so that the turning on/off of the LED chips is performed in the light source device 100.

For example, the external connection pad 140 may be provided in plurality and may include a data input pad, a data output pad, a power input pad, and a ground pad. The data input pad may be provided to transmit (or transfer) a control signal (or data) for controlling the LED chip 110 from the outside (e.g., an external controller) to the control circuit 125, and the control signal may be input into the data input pad.

The data output pad may output the control signal input to the data input pad, may be electrically connected to the data input pad of another (surrounding) light source device 100, and may transmit or input the control signal to the data input pad that is electrically connected thereto. In this manner, the control signal may be transmitted to all the light source devices 100 of the display apparatus 200. Here, the data output pad may be input to the data input pad to output the control signal passing through the control circuit 125, and the control signal output in this manner may be input into the data input pad of another light source device 100.

The power supply pad may be provided to supply power to the control circuit 125 from the outside (e.g., external power supply), and power for driving (or turning on/off) the LED chip 110 may be input into the power supply pad.

The ground pad may be provided for grounding the light source device 100 by including the control circuit 125, and may be grounded (or connected to the ground). Thus, the power input to the power supply pad may be transmitted (flow) to the ground pad to turn on/off the LED chip 110.

The number of external connection pads 140 is not proportional to (or equal to) the number of LED chips 110, but only four external connection pads 140 may be provided regardless of the number of LED chips 110. That is, even when three or less or five or more LED chips 110 are bonded on the driving controller 120, only four external connection pads 140 for driving (or controlling) the control circuit 125 may be provided regardless of the number of LED chips 110.

Each external connection pad 140 may not be used for directly transmitting the power, the control signal, etc. to (each of) the LED chips 210, but may be used for transmitting the power, the control signal, etc., which are required for driving the control circuit 125 to control the driving of the LED chips 110 through the control circuit 125, and thus, only four external connection pads 140 may be provided.

Here, the plurality of LED chips 110 may be electrically connected to the control circuit 125 inside the driving controller 120 through the electrode pad 130 provided on the top surface of the driving controller 120, and thus, the turning on/off of the plurality of LEDs may be individually controlled by the control circuit 125.

Therefore, since the external connection pad 140 for electrically connecting the light source device 100 to the circuit board 210 is not provided to directly connect the LED chip 110 to the circuit board 210, only four external connection pads 150 for the connection with the control circuit 125 may be provided regardless of the number of LEDs 110.

In addition, the external connection pad 140 may further include a clock pad, and the clock pad may be provided to transmit a clock CLK to the control circuit 125 from the outside and thus may be used for temporal control of the LED chips 110. Here, as for the clock pad, one of the four external connection pads 140 may be changed, or the external connection pad 140 may be additionally provided (or formed) in addition to the four external connection pads 140.

Here, an interval between the plurality of external connection pads 140 may be approximately 30 μm to approximately 800 μm. When the interval between the plurality of external connection pads 140 is narrower than approximately 30 μm, bonding of each of the plurality of external connection pads 140 to the circuit board 210 may not be impossible because the interval between the plurality of external connection pads 140 is too narrow. If the interval between the plurality of external connection pads 140 is wider than approximately 800 μm, the light source device 100 may not be mounted on the circuit board 210 because the interval between the plurality of external connection pads 140 is too wide, or the number of light source devices 100 that are capable of being mounted on the circuit board 210 may be reduced. Thus, the interval between the plurality of external connection pads 140 may be approximately 30 μm to approximately 800 μm, and the interval between the plurality of external connection pads 140 may be maintained at approximately 40 μm to maintain the circuit board 210 used in the related art. The plurality of external connection pads 140 may be disposed to be spaced a maximum interval from the outermost periphery of the light source device 100 to prevent physical damage and thermal stress from having an influence on the LED chips 110 and/or the control circuit 125 because the external connection pas 140 is bonded to and mounted on the circuit board 210.

Therefore, the light source device 100 in accordance with an exemplary embodiment may be simply mounted by bonding the external connection pad 140 to the circuit board 210 and may be easily mounted on the circuit board 210 through the external connection pad 140, and thus, the wire bonding may be eliminated.

In addition, the driving controller 120 may further include a through-electrode 122 connected to the external connection pad 140 to pass through the substrate 121. The through-electrode 122 may (at least) pass through the substrate 121 and may be connected to the external connection pad 140. For example, the through-electrode 122 may be provided by filling a through-hole defined by passing through the substrate 121 with a conductive material to improve conductivity, and the conductive material may be copper (Cu), nickel (Ni), silver (Ag), gold (Au), and the like, which have good conductivity (or high electrical conductivity). Here, when the substrate 121 is a silicon substrate, the through-electrode 122 may be a through-silicon via (TSV), and when the substrate 121 is a glass substrate, the through-electrode 122 may be a through-glass via (TGV).

The through-electrode 122 may connect the external connection pad 140 to the control circuit 125, and only the external connection pad 140 may be provided on the bottom surface (i.e., the bottom surface of the substrate) of the driving controller 120, and only the external connection pad 140 may be electrically connected to the circuit board 210. Thus, sheet resistance (or line resistance) of the circuit board 210 may be minimized.

In addition, the external connection pad 140 for transmitting the electrical signal provided from the outside to the control circuit 125 of the driving controller 120 may be provided on the bottom surface of the driving controller 120 at a side opposite to the LED chip 110 to further improve transparency when the light source device 100 is mounted on the transparent circuit board 210, thereby implementing more transparent display apparatus 200 (compared to the structure in accordance with the related art).

In addition, the through-electrode 122 may connect the external connection pad 140, which electrically connects the light source device 100 to the circuit board 210, to the control circuit 125 electrically connected to the LED chip 110 to reduce an electrical connection distance between the chip 110 and the circuit board 210 and simplify a configuration (or structure) of the driving controller 120 such as the control circuit 125.

Here, the turning on/off of the plurality of LED chips 110 may be controlled by individually controlling the driving of the plurality of LED chips 110 by the control circuit 125 provided inside the driving controller 120. Thus, the connection between each LED chip 110 and the control circuit 125 may be performed through the electrode pad 130 provided on the top surface of the driving controller 120. In addition, the control circuit 125 may be provided in the driving controller 120 in a shape in which the line layers 125a, 125b, and 125c pass through the inside of (each of) the insulating layers through the conductive vias 125d and 125e that at least partially pass through the insulating layers 123. In addition, the control circuit 125 may be (electrically) connected to the external connection pad 140 through the through-electrode 122 inside the through-hole defined in the substrate 121, and when the light source device 100 is electrically connected to the circuit board 210 through the external connection pad 140, the driving of the plurality of LED chips 110 may be individually controlled through the control circuit 125, and the turning on/off the plurality of LED chips 110 may also be controlled.

In this manner, the electrical connection structure between each LED chip 110 and the control circuit 125 may be provided inside the driving controller 120 (i.e., the inside of the insulating layer), and thus, the line (i.e., the line layer) for connecting the components (e.g., the LED chip and the driving controller) may not be complicatedly exposed to the outside (of the driving controller or the insulating layer) and prevent the electrical connection from being damaged due to external impact. In addition, since the connection between each LED chip 110 and the control circuit 125 is provided by the electrode pad 130 disposed (or provided) on the top surface of the driving controller 120, and the connection between the control circuit 125 and the external connection pad 140 is provided through the through-electrode 122 that passes through the substrate 121 and is not exposed (to the outside), cumbersome and difficult work for connecting the lines to each component (for example, the LED chip, the driving controller, and the external connection pad) may be eliminated, and the light source device 100 may be manu-factured easily and quickly, and also, the components con-stituting the light source device 100 may be integrated into one device (or module) so that the light source device 100 is provided in the form of a driver-integrated device.

The driving controller 120 may reduce the number of components for controlling the plurality of LED chips 110 by integrating (or grouping) the plurality of LED chips 110 into one, and the formation operation of the component(s) may be simplified.

The light source device 100 in accordance with an exem-plary embodiment may further include a test pad 150 provided on the top surface of the driving controller 120 and electrically connected to the control circuit 125 to preform electrical measurement.

The test pad 150 may be spaced apart from the electrode pad 130 and provided on the top surface of the driving controller 120, may be electrically connected to the control circuit 125, and may perform the electrical measurement for the control circuit 125 and the like. For example, the test pad 150 may be a pad to which a probe pin is in contact in a test process, electrical measurement may be performed by being in contact with the probe pin to detect whether the control circuit 125 is electrically defective.

If there is no test pad 150, in order to measure the electrical circuit characteristics of the control circuit 125, a plurality of probe pins have to be in contact with the external connection pad 140 and the electrode pad 130, respectively, to perform the electrical measurement. Thus, since the electrode pad 130 is provided on the top surface of the driving controller 120, and the external connection pad 140 is provided on the top surface of the driving controller 120, the electrical circuit characteristics of the control circuit 125 may not be measured using a probe card that is in contact with only one side.

However, in the present disclosure, the electrical circuit characteristics of the control circuit 125 may be measured at one surface by using one probe card through the test pad 150 provided on the driving controller 120, like the electrode pad, and electrically connected to the control circuit 125, and thus, a fine error of the control circuit 125 may be corrected. Thus, during mass production, errors of each control circuit 125 and/or LED chip 110 may be consistently adjusted, and each element unit (for example, the driving controller entering one light source device) may perform the functions of measuring and correcting.

The test pad 150 may detect (or test) whether the LED chip 110 is electrically defective after the LED chip 110 is bonded to the electrode pad 130, and the LED chip 110 determined to be defective may be replaced with another LED chip 110.

As described above, since the light source device 100 in accordance with an exemplary embodiment may be a driver-integrated type, the testing may be simplified, and test defects may be easily detected through the test pad 150.

Furthermore, the light source device 100 in according with an exemplary embodiment may further include a via plug 155 connected to the test pad 150 and partially passing through the drive controller 120.

The via plug 155 may be connected to the test pad 150 to partially pass through the driving controller 120 and may be electrically connected to the control circuit 125 by at least partially passing through the insulating layer 123. Thus, the test pad 150 may be electrically connected to the control circuit 125 while being (also) provided on the top surface of the driving controller 120.

That is, the test pad 150 may be provided (or disposed) on the same plane as the electrode pad 130 through the via plug 155, and thus, the test pad 150 and the electrode pad 130 may be provided to be easily in contact with each of the probe pins at the same time.

The drive controller 120 may further include a shared connection pad 124 disposed on the top surface of the substrate 121 and be connected to the control circuit 125 so that a lower end of the via plug 155 and an upper end of the through-electrode 122 are electrically connected to the con-trol circuit 125. The shared connection pad 124 may be disposed on the top surface of the substrate 121 and may be connected to the control circuit 125, so that the lower end of the via plug 155 and the upper end of the through-electrode 122 are electrically connected to the control circuit 125. For example, the shared connection pad 124 may be directly or indirectly connected to the line layers 125a, 125b, and 125c and/or the conductive vias 125d and 125e, and be connected to the line layers 125a, 125b, or 125c through the conductive vias 125d and 125e connected to the shared connection pad 124 to at least partially pass through the insulating layer 123.

Due to the shared connection pad 124, the external connection pad 140 may be prevented from being directly connected to the control circuit 125, and thus, the physical damage and the thermal stress while the external connection pad 140 is bonded to and mounted on the circuit board 210 may not be affected on the control circuit 125.

In addition, the test pad 150 may also be connected to the shared connection pad 124 through the via plug 155 so that the electrical signal path in the control circuit 125 are the same in all of the test pad 150 and the external connection pad 140.

In this case, the lower end of the via plug 155 and the upper end of the through-electrode 122 may be offset from each other and connected to the top and bottom surfaces of the shared connection pad 124, respectively. That is, the via plug 155 and the through-electrode 122 may not be arranged in a straight line and may be spaced apart (or misaligned) from each other in the horizontal direction (or left and right direction) when it is assumed to be viewed from above (downward). In this case, while forming the through-hole for forming the through-electrode 122 and the via hole for forming the via plug 155, the damage to the shared connec-tion pad 124 and (electrical) short circuit with the control circuit 125 may be suppressed and prevented.

Strong vibration (wave) and heat may be generated while forming the through-hole, and partial (red) damage (or micro (severe) damage) may occur in the shared connection pad 124 by such vibration and/or heat. In this situation, if the via hole is also formed in the straight line with the through-hole, the shared connection pad 124 may be completely damaged by the strong vibration and heat generated while forming the via hole and thus may be physically and electrically short-circuited with the control circuit 125.

However, when the lower end of the via plug 155 and the upper end of the through-electrode 122 are misaligned and connected to different positions of the shared connection pad 124, a position of partial damage generated while forming the through-hole and the via hole and a position of partial damage generated while forming the via hole may be different from each other, and thus, the shared connection pad 124 may not be completely damaged, and the control circuit 125 may not be short-circuited physically as well as electrically. Here, the partial damage means damage that does not affect the driving of the light source device 100 (e.g., driving of the control circuit), and the complete damage means damage that prevents the light source device 100 from being driven (e.g., the control circuit is damaged and thus is not driven).

The shared connection pad 124 may be disposed on the top surface of the n-th insulating layer, the through-electrode 122 may partially pass through not only the substrate 121 but also the insulating layer 123, and the upper end thereof may be connected to a bottom surface of the shared connection pad 124 through the first insulating layer 123a to (up to) the n-th insulating layer.

The test pad 150 may be spaced apart from the electrode pad 130 and provided on an edge portion of the top surface of the driving controller 120. Here, the electrode pad 130 may be provided at a central portion of the top surface of the driving controller 120. The test pad 150 may be a pad for electrical measurement by contacting the probe pin in a test process. Since the test pad 150 is used only in the test process, but is not involved in driving the light source device 100 at all, the test pad 150 may be disposed (or formed) on the edge portion of the top surface of the driving controller 120 to the outside without interfering with the electrode pad 130 to which the LED chip 110 is bonded. For example, the test pad 150 may be spaced apart from (i.e., spaced apart from the LED chip) the electrode pad 130 so that the test pad 150 does not affect the light emitted from the LED chip 110, such as absorbing the light emitted from the LED chip 110 by the test pad 150 to provide the test pad 150 on the edge portion of the top surface of the driving controller 120.

Here, a diameter of the lower end of the through-electrode 122 may be approximately 30 μm to approximately 800 μm and may be larger than that of the upper end of the through-electrode 122. When the diameter of the lower end of the through-electrode 122 is less than approximately 30 μm, resistance of the through-electrode 122 may increase, and a flow of electricity may not be smooth. In this case, the overall size of the light source device 100, such as the substrate 121, may increase in order to secure the spaced distance between the through-electrodes 122. When the diameter of the lower end of the through-electrode 122 is greater than approximately 800 μm, contact resistance with the external connection pad 140 may increase while being connected to the external connection pad 140, and it may be difficult to realize ohmic contact between the through-electrode 122 and the external connection pad 140. Thus, the diameter of the lower end of the through-electrode 122 may be approximately 30 μm to approximately 800 μm, or approximately 40 μm.

In this case, the diameter of the lower end of the through-electrode 122 may be greater than that of the upper end of the through-electrode 122, and thus, filling uniformity of the conductive material forming the through-electrode 122 by filling the through-hole may be improved, and also, an electrical loss occurring when the electrical signal is applied may be minimized, and reliability may be secured. Thus, it is possible to minimize the electric resistance of the portion (or component) connecting the external connection pad 140 to the control circuit 125, and in the path of the electrical signal from the external connection pad 140 through the through electrode 122 and the shared connection pad 124, the electrical resistance may be minimized or may be zero.

Also, the through-electrode 122 may have a length of approximately 40 μm to approximately 1,000 μm. When the length of the through-electrode 122 is less than approximately 40 μm, the control circuit 125 may be damaged (or broken) by solder damage and vibration, and when the length of the through-electrode 122 is greater than approximately 1,000 μm, the resistance of the through-electrode 122 may increase, and thus, the electricity flow may not be smooth. Therefore, the through-electrode 122 may have a length of approximately 40 μm to approximately 1,000 μm, or approximately 50 μm so that the resistance of the through electrode 122 is reduced while securing at least 40 μm or more so as to prevent the damage to the control circuit 125 due to the solder damage and vibration.

The light source device 100 in according with an exemplary embodiment may further include a molding part 160 covering the LED chip 110 on the driving controller 120.

The molding part 160 may cover at least the LED chip 110 on the driving controller 120, may be provided to cover the side and top surfaces of the LED chip 110, and may cover and protect the LED chip 110. Here, the molding part 160 may be disposed on the driving controller 120 to surround the LED chip 110, cover the top surface of the driving controller 120, and cover the side and top surfaces of the LED chip 110. Here, the molding part 160 may cover the driving controller 120 while covering the LED chip 110 to protect the driving controller 120 and the LED chip 110, and also protect the substrate 121, the control circuit 125, and the LED chip 110. For example, the molding part 160 may be made of a semiconductor encapsulation material to protect the LED chip 110 and/or the substrate 121 and the control circuit 125 from moisture and oxygen, may include a material having excellent light transmittance for light emitted from the LED chip 110, may contain transparent silicone or epoxy resin, and include a silicon-based resin, a ceramic-based resin, or an organo-silane-based resin.

Here, the molding part 160 may include a black additive (or black pigment), a scattering agent, or a fluorescent material. That is, the molding part 160 may include at least one of the black additive, the scattering agent, or the fluorescent material, and may include any one or two or more selected from the black additive, the scattering agent, and the fluorescent material. The black additive may improve black contrast, and a black color additive such as carbon may be contained in the molding part 160. For example, the molding part 160 may include a black material so that the light source device 100 has black visibility (e.g., opaque or black) when viewed from above, and the black pigment contained in the insulating base material, and may be made of a material in which an epoxy resin and carbon black are mixed. Thus, complete (or perfect) black may be implemented without light leakage (or mixing of light) when black is displayed.

The scattering agent may be contained in the molding part 160 provided in the light emitting direction of the LED chip 110 to scatter external light incident onto the molding part 160 from the outside, may reduce reflectance of the external light incident onto a surface of the molding part 160, and effectively emit the light emitted from the LED chip 110 to reach the molding part 160 to the outside (or in the light emitting direction). Thus, light extraction efficiency of the light source device 100 may be improved.

The fluorescent material may adjust a color of the light emitted from the LED chip 110, such as color coordinates, color temperature, and color rendering, may be made of a phosphor resin, and protect the LED chip 110 against environmental conditions such as temperature, humidity, vibration, and shock. In addition, a white light source with high efficiency may be implemented using the fluorescent material.

The molding part 160 may bond the LED chip 110 to the electrode pad 130 and then test the LED chip 110 for the electrical defects through the test pad 150 so as to be formed when the defects of the LED chip 110 are not detected.

The LED chip 110 may be provided in plurality, and the plurality of LED chips 110 may have first and second electrodes 111 and 112, respectively. The LED chip 110 may be provided in plurality and may include a red (R) LED chip 110, a green (G) LED chip 110, and a blue (B) LED chip 110. Due to the three-color LED chip 110 having the three primary colors of light, only the red (R) LED chip 110 may be turned on to emit red (light), only the green (G) LED chip 110 may be turned on to emit green (light), and only the blue (B) LED chip 110 may be turned on to emit blue (light). In addition, the white color (light) may be displayed by turning on all the three-color LED chips 110, or a black color may be displayed by blinking all the three-color LED chips 110, and an intensity ratio of the three-color LED chips 110 may be adjusted to emit various colors (phases).

The plurality of LED chips 110 may have first and second electrodes 111 and 112, respectively. Here, the first electrode 111 may be an anode electrode, and the second electrode 112 may be a cathode electrode. Here, power may be supplied to the first electrode 111, and the second electrode 112 may be grounded. Among the plurality of LED chips 110, (each of) the LED chips 110 in which power is supplied to the first electrode 111, and the second electrode 112 is grounded, may be turned on.

In addition, the electrode pad 130 may include a first electrode pad 131 respectively connected to the first electrode 111 of each LED chip 110, and a second electrode pad 132 respectively connected to the second electrode 112 of each LED chip 110. The first electrode pads 131 may be bonded by connecting the first electrodes 111 of the LED chip 110 and may be provided in plurality that are equal to the number of the plurality of LED chips 110. Thus, each of the first electrode pads 131 may be connected to the first electrode 111 of each LED chip 110, and the electrical signal (e.g., power) may be supplied to each of the first electrode pads 131 through the control circuit 125.

The second electrode pads 132 may be bonded by connecting the second electrodes 112 of the LED chip 110 and may be provided in plurality that are equal to the number of the plurality of LED chips 110. Thus, each of the second electrode pads 132 may be connected to the second electrode 112 of each LED chip 110, and may be grounded.

The first electrode 111 of each LED chip 110 may be respectively connected to each of the first electrode pads 131, and the second electrode 112 of each LED chip 110 may be respectively connected to each of the second electrode pads 132. As a result, the driving of the plurality of LED chips 110 may be individually controlled by the control circuit 125.

Each of an interval between two adjacent first electrode pads 131 and an interval between two adjacent second electrode pads 132 may be approximately 1 μm to approximately 300 μm. That is, the interval between the plurality of LED chips 110 may be approximately 1 μm to approximately 300 μm. The interval between each LED chip 110 may be approximately 1 μm to approximately 300 μm, but may not exceed approximately 300 μm so that the light emitted from the plurality of LED chips 110 is well mixed, and in the related art, although the plurality of LED chips are arranged at an interval of approximately 200 μm or more is provided for technical limitations and workability, in the present disclosure, an interval between two adjacent first electrode pads 131 and an interval between two adjacent second electrode pads 132 may be provided to approximately 200 μm or less to secure optimal mass productivity and performance. Thus, the (emission) size of the light source device 100 may be reduced, and thus, high-resolution integration may be achieved, and it may prevent the light source device 100 from generating different mixed colors at different angles.

In order to realize a finer pitch, a size of the small electrode pad 130 may be manufactured by a semiconductor process by laminating copper (Cu) in a pillar shape and forming a final silver (Ag) layer. However, when the electrode pad 130 is manufactured in the form of a bump, an additional process for adjusting flatness of the surface may be performed, and the flat surface of the bump may be provided so that the LED chip 110 is maintained to be flatness.

In addition, the grounded second electrode pad 132 may be connected to the shared connection pad 124 connected to the ground pad, not to the line layer 125a, 125b, or 125c, through the conductive via passing through the surface of the uppermost insulating layer 123d.

In each LED chip 110, the first electrode 111 and the second electrode 112 may be directly connected to the first electrode pad 131 and the second electrode pad 132, respectively, so as to be flip-chip bonded. Each LED chip 110 may be flip-chip bonded by directly connecting the first electrode 111 and the second electrode 112 to the first electrode pad 131 and the second electrode pad 132, respectively. As a result, a space to be used may be minimized, and the light source device 100 may have a structure that is minimized in space use. Thus, the line bonding may be eliminated while manufacturing the light source device 100. Here, the electrode pad 131 and the second electrode pad 132 may not be connected in the straight line so that the physical damage and thermal stress do not affect the control circuit 125 when the control circuit 125 bonds the LED chip 110 to the first electrode pad 131 and the second electrode pad 132.

Figure 4:
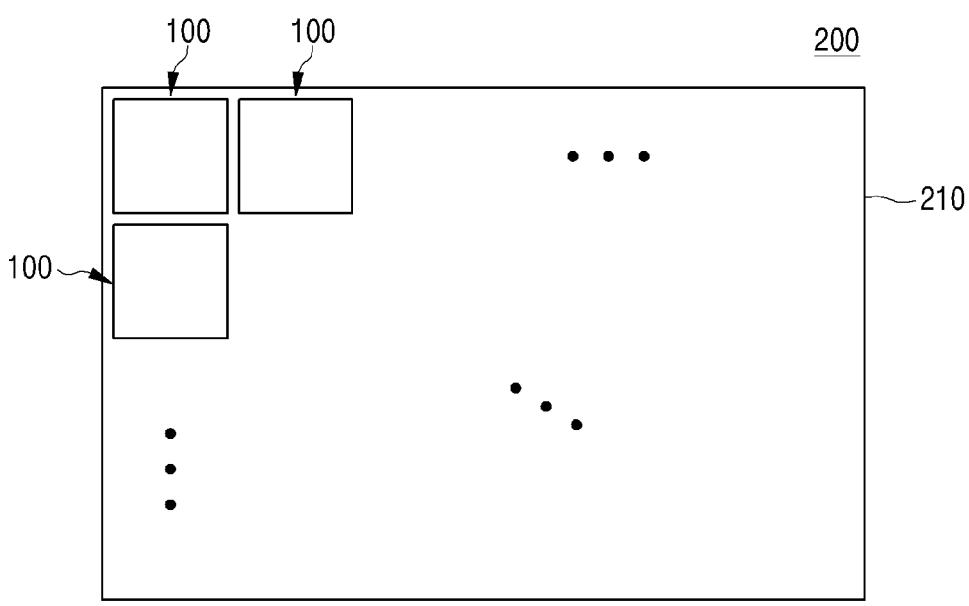
FIG. 4 is a view illustrating a display apparatus in accordance with another exemplary embodiment.

FIG. 4 is a view illustrating a display apparatus in accordance with another exemplary embodiment.

A display apparatus in accordance with another exemplary embodiment will be described with reference to FIG. 4. In descriptions of a device in accordance with another exemplary embodiment, which are duplicated with respect to the edge ring in accordance with the foregoing embodiment, will be omitted.

The display apparatus 200 in accordance with another exemplary embodiment may include a light source device 100 in accordance with an exemplary embodiment, and a circuit board 210 on which the plurality of light source devices 100 are arranged and mounted.

The light source device 100 may be the light source device 100 in accordance with an exemplary embodiment. Here, the drive controller 120 and the LED chip 110 may be minimized and integrated into the single driver-integrated device, and thus, even when the LED chip 110 is provided in plurality, the light source device 100 may be miniaturized and subminiatured. The light source device 100 may be easily mounted on the circuit board 210.

The plurality of light source devices 100 may be arranged and mounted on the circuit board 210, and also, the plurality of light source devices 100 may be disposed in consideration of an entire pixel arrangement and pixel pitch of the display apparatus 200. Here, the circuit board 210 may be implemented as one of substrates made of various materials, such as a printed circuit board (PCB), a flexible printed circuit board (FPCB), and the like. Since the chip 110 or the control circuit 125 is not directly mounted, the type of circuit boards 210 may be selected in consideration of ease, efficiency, and cost in the manufacturing process. For example, the display apparatus 200 has an array of pixels in a matrix of M×N (M and N are integers greater than or equal to 2), and the light source device 100 has a pixel array of m×n (m and n are integers greater than or equal to 1). When the LED chips 110 are arranged in the pixel array of the matrix, M/m light source devices 100 may be arranged along a column direction (e.g., vertical direction), and N/n light source devices 100 may be disposed along a row direction (e.g., a horizontal direction). One light source device 100 may be one pixel.

The display apparatus 200 in according with another exemplary embodiment may be a package of several bundles of the light source devices 100 on the circuit board 210, and the subminiatured light source device 100 may be packaged to implement a high-resolution display with a smaller size (compared to the structure in accordance with the related art).

The display apparatus 200 in according with another exemplary embodiment may further include an external controller (not shown) and an external power source (not shown), and the external controller (not shown) may be connected to a data input pad among external connection pads 140 to input a control signal (or data) for controlling the LED chip 110, and the external power source (not shown) may be connected to a power input pad among the external connection pads 140 to supply power to the light source element 100.

As described above, the LED chip that emits the light may be bonded to the electrode pad provided on the top surface of the driving controller so that the driving controller and the LED chip are minimized and integrated into the single driver-integrated device, and thus, even when the LED chip is provided in plurality, the light source device may be miniaturized and subminiatured. In addition, since the driving controller is provided at the opposite side of the light emitting direction of the LED chip, the light emitted from the LED chip may not be absorbed to the driving controller, and thus, the light loss by the driving controller may be excluded to minimize the light loss of the light source device. Here, the driving controller may control the plurality of LED chips by grouping the LED chips together) to reduce the number of components for controlling the plurality of LED chips and simplify the formation of the component. In addition, the test in accordance with the driver-integrated type may be simplified, and the test failure detection may be facilitated through the test pad. In addition, the external connection pad that transmits the external electrical signal to the control circuit of the driving controller may be provided on the bottom surface of the driving controller disposed at the opposite side of the LED chip to more improved the transparency when the light source device is mounted on the transparent circuit board, and thus, more transparent display apparatus may be implemented. In addition, such the light source device may be easily mounted on the circuit board, and the display apparatus, in which the light source device is packaged in several bundles on the circuit board, may implement the high-resolution display with the smaller size by packaging the subminiatured light source devices.

In the light source device in accordance with the exemplary embodiment of the present invention, the LED chip that emits the light may be bonded to the electrode pad provided on the top surface of the driving controller so that the driving controller and the LED chip are minimized and integrated into the single driver-integrated device, and thus, even when the LED chip is provided in plurality, the light source device may be miniaturized and subminiatured.

In addition, since the driving controller is provided (or disposed) at the opposite side of the light emitting direction of the LED chip, the light emitted from the LED chip may not be absorbed to the driving controller, and thus, the light loss by the driving controller may be excluded (or eliminated) to minimize the light loss of the light source device.

Here, the driving controller may control the plurality of LED chips by integrating (or grouping the LED chips together) to reduce the number of components for controlling the plurality of LED chips and simplify the formation (or mounting) of the component(s).

In addition, the test in accordance with the driver-integrated type may be simplified, and the test failure detection may be facilitated through the test pad.

In addition, the external connection pad that transmits the external electrical signal to the control circuit of the driving controller may be provided on the bottom surface of the driving controller disposed at the opposite side of the LED chip to more improved the transparency when the light source device is mounted on the transparent circuit board, and thus, more transparent display apparatus may be implemented (compared to the structure in accordance with the related art).

In addition, such the light source device may be easily mounted on the circuit board, and the display apparatus, in which the light source device is packaged in several bundles on the circuit board, in accordance with the present disclosure may implement the high-resolution display with the smaller size by packaging the subminiatured light source devices (compared to the structure in accordance with the related art).

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present invention shall be determined by the technical scope of the accompanying claims.

What is claimed is:

1. A light source device comprising:
   a LED chip configured to emit light;
   a driving controller provided with a control circuit to control driving of the LED chip;
   an electrode pad provided on a top surface of the driving controller so that the LED chip is bonded and configured to transmit an electrical signal provided from the driving controller to the LED chip;
   an external connection pad provided on a bottom surface of the driving controller and electrically connected to the control circuit to transmit an electrical signal provided from the outside to the control circuit;
   a test pad provided on the top surface of the driving controller so as to be electrically connected to the control circuit and configured to perform electrical measurement; and
   a via plug connected to the test pad to partially pass through the driving controller,
   wherein the driving controller comprises:
   a substrate on which the control circuit is disposed;
   a through-electrode connected to the external connection pad to pass through the substrate; and
   a shared connection pad connected to the control circuit on the top surface of the substrate to electrically connect each of a lower end of the via plug and an upper end of the through-electrode to the control circuit, wherein the electrode pad is laminated on a top surface of the substrate on which the control circuit is disposed, and the driving controller is provided at an opposite side of a light emitting direction of the LED chip, wherein the lower end of the via plug and the upper end of the through-electrode are misaligned to be connected to top and bottom surfaces of the shared connection pad, respectively, and wherein a lower end of the through-electrode has a diameter of 30 μm to 800 μm and greater than that of an upper end of the through-electrode.

2. The light source device of claim 1, wherein the test pad is spaced apart from the electrode pad and provided on an edge portion of the top surface of the driving controller.

3. The light source device of claim 1, wherein the through-electrode has a length of 40 μm to 1,000 μm.

4. The light source device of claim 1, wherein the external connection pad is provided in plurality, and an interval between the plurality of external connection pads ranges of 30 μm to 800 μm.

5. The light source device of claim 1, wherein the driving controller further comprises an insulating layer disposed on the top surface of the substrate, the control circuit comprises:

a line layer disposed on the top surface of the substrate so as to be covered by the insulating layer; and a conductive via configured to at least partially pass through the insulating layer so as to be connected to the line layer, and the electrode pad is disposed on the insulating layer so as to be connected to the conductive via.

6. The light source device of claim 1, further comprising a molding part configured to cover the LED chip on the driving controller.

7. The light source device of claim 6, wherein the molding part comprises a black additive, a scattering agent, or a fluorescent material.

8. The light source device of claim 1, wherein the LED chip is provided in plurality, the plurality of LED chips comprise first and second electrodes, and the electrode pad comprises:

a first electrode pad connected to the first electrode of each of the LED chips; and a second electrode pad connected to the second electrode of each of the LED chips.

9. The light source device of claim 8, wherein each of an interval between two adjacent first electrode pads and an interval between two adjacent second electrode pads ranges of 1 μm to 300 μm.

10. The light source device of claim 8, wherein each of the LED chips is flip-chip bonded by directly connecting the first electrode and the second electrode to the first electrode pad and the second electrode pad, respectively.

11. A display apparatus comprising:

a light source device of claim 1; and a circuit board on which a plurality of light source devices are arranged and mounted.

* * * * *